United States Patent [19]

Ebihara

[11] 4,258,275

[45] Mar. 24, 1981

[54] MINIATURE ELECTRONIC DEVICE

[75] Inventor: Heihachiro Ebihara, Tokorozawa, Japan

[73] Assignee: Citizen Watch Co., Ltd., Tokyo, Japan

[21] Appl. No.: 904,711

[22] Filed: May 10, 1978

[30] Foreign Application Priority Data

May 13, 1977 [JP] Japan .................................. 52-54419

[51] Int. Cl.$^{3}$ ........................ H03K 17/51; G04C 3/00

[52] U.S. Cl. .................................... 307/511; 307/239; 307/238.8; 368/219

[58] Field of Search ................... 307/238, 251, 15, 29, 307/31, 36, 38, 39, 239; 58/23 A, 23 BA, 23 AC, 23 R, 33, 85.5

[56] References Cited

U.S. PATENT DOCUMENTS

| | | | |
|---|---|---|---|
| 2,957,993 | 10/1960 | Sichling | 307/31 X |
| 3,549,911 | 12/1970 | Scott, Jr. | 307/251 X |
| 3,751,676 | 8/1973 | Igarashi et al. | 307/31 |
| 3,778,998 | 12/1973 | Berney | 58/23 AC |
| 3,791,133 | 2/1974 | Hashimura et al. | 58/23 AC |
| 3,861,263 | 1/1975 | Okudaira | 307/251 X |
| 3,864,817 | 2/1975 | Lapham, Jr. | 357/51 X |
| 4,043,109 | 8/1977 | Numabe | 58/23 AC X |

*Primary Examiner*—Larry N. Anagnos

*Attorney, Agent, or Firm*—Jordan and Hamburg

[57] ABSTRACT

Adjustments in a miniature electronic device are rapidly accomplished through electronic switching using non-volatile semiconductor memory elements which memorize the amount of an adjustment. Adjustments are accomplished by the application of positive or negative voltages.

6 Claims, 22 Drawing Figures

(MNOS)

Fig. 8A
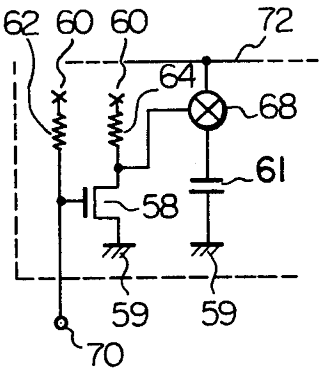
Fig. 8B
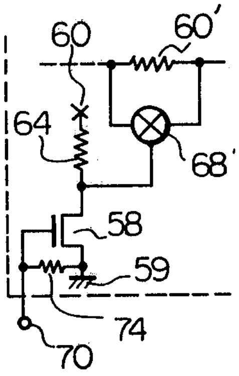
Fig. 8C
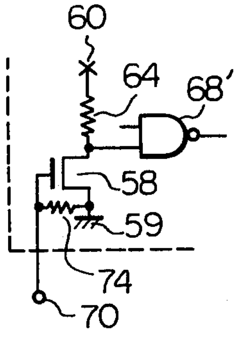
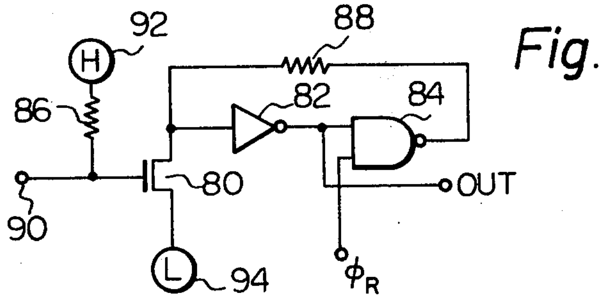
Fig. 9
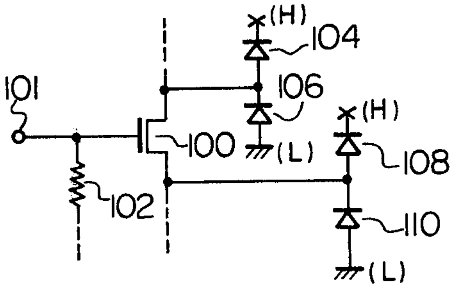
Fig. 10

MINIATURE ELECTRONIC DEVICE

This invention relates to a miniature electronic device such as a timepiece, portable calculator or the like.

In the circuitry of the abovementioned devices there is a need to adjust mainly analog quantities even after the devices have been assembled. There is thus a necessity to selectively switch states within the circuitry from the outside, hence the need for a switching-type semi-fixed adjustment circuit.

In the past it was the most common practice to selectively connect the external terminals of the devices to either the positive or negative terminals of a power source. Adjustment, however, was a time consuming operation.

It is therefore an object of the present invention to overcome the shortcomings encountered in the prior art.

In accordance with the present invention, a non-volatile semiconductor memory element is adapted such that adjustments in electronic devices of the type described can be easily and rapidly accomplished.

Other objects, features and advantages of the present invention will become more apparent from the following description when taken in conjunction with the accompanying drawings, in which:

FIGS. 8A to 8C are circuit diagrams of terminals formed through the use of non-volatile memory elements in accordance with the present invention;

FIG. 9 is a circuit diagram of another preferred embodiment of a circuit having terminals formed through the use of a non-volatile memory element in accordance with the present invention; and FIG. 10 is a circuit diagram of a circuit having a non-volatile memory element and adapted to include diodes.

Figure 1A:
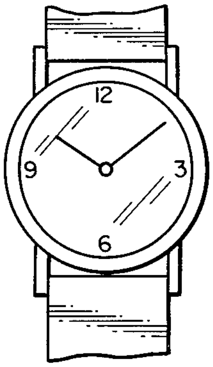
FIGS. 1A and 1B show the external appearance of miniature electronic devices in accordance with the present invention.
Figure 1B:
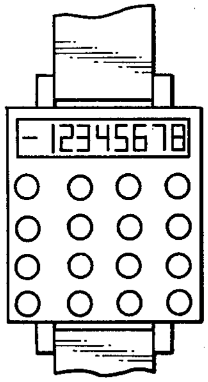

An electronic device of FIG. 1A is an analog-type wristwatch, and that of FIG. 1B a digital-type wristwatch equipped with a calculator.

Figure 2:
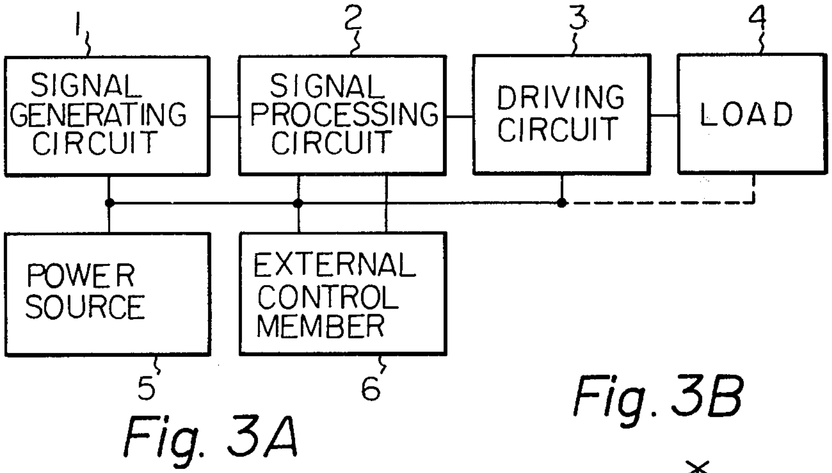
FIG. 2 is a block wiring diagram of a circuit of the miniature electronic device shown in FIGS. 1A and 1B.

Referring to FIG. 2 which is a block wiring diagram of a typical circuit found in electronic devices of the type shown in FIGS. 1A and 1B, the output of a signal generating circuit 1 is supplied to a signal processing circuit 2 the output of which is applied to a load 4 through a driving circuit 3. An external control member 6 such as a crown or key board is connected to signal processing circuit 2, and a power source 5 supplies power to each of the blocks 1, 2, 3, 4 and 6.

In electronic devices of the type described it is often required to perform the adjustment of analog quantities.

In FIG. 2, for example, signal generating circuit 1 includes an oscillator the oscillating frequency of which must ultimately fall within a given range of values. Accordingly, there are many cases in which some adjustment is required.

Figure 3A:
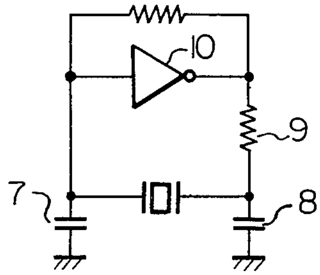
FIGS. 3A and 3B are circuit diagrams illustrating one example of a quartz crystal oscillator circuit.

One example of a quartz crystal oscillating circuit widely used to generate signals in an electronic device of the type described is shown in FIG. 3A. In order to adjust the oscillating frequency of the oscillator, it suffices to vary either or both of an input capacitor 7 and output capacitor 8. If it is permissible to mount these capacitors externally, adjustment can be readily accomplished by making use of trimmer-type capacitors. However, if the capacitors 7, 8 are incorporated in an IC chip, it is necessary to perform the adjustment by dividing the capacitances as required and selectively wiring them. Such a construction is shown in FIG. 4A.

Figure 3B:
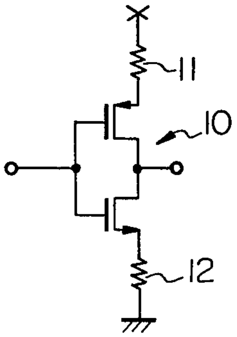

In FIG. 3A, the oscillating frequency varies as the resistance 9 is changed, but the amplitude of the oscillations changes at the same time. If the inverter 10 has the structure shown in FIG. 3B, the result is the same even if resistors 11, 12 are varied. Accordingly, there are cases where the abovementioned resistors are adjusted in order to adjust such analog quantities related to the oscillator circuit as oscillating frequency, amplitude, current consumption, etc. The structure of such a circuit is illustrated in FIG. 4B.

Values to be adjusted are not necessarily limited to passive values. For example, there are cases where the number of diodes may be changed, as shown in FIG. 4C, or cases where the input states of logic gates in electronic timepieces may be selectively wired in order to adjust the speed by increasing or decreasing the number of time standard pulses in certain given periods for the sake of performing the so-called digital frequency adjustment. Such a set-up is shown in FIG. 4D.

Figure 4A:
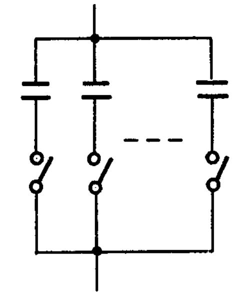
FIGS. 4A to 4D are circuit diagrams illustrating methods of selectively connecting elements according to the prior art.
Figure 4B:
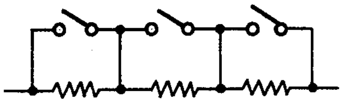
Figure 4C:
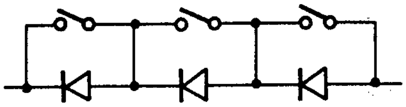
Figure 4D:
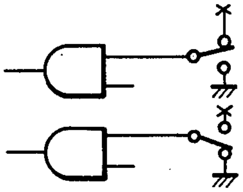
Figure 5A:
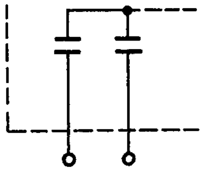
FIGS. 5A to 5D show a partial circuit diagrams illustrating methods of leading out terminals.
Figure 5B:
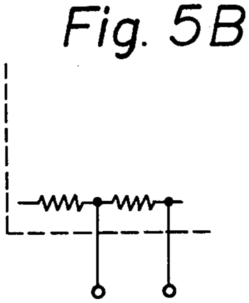
Figure 5C:
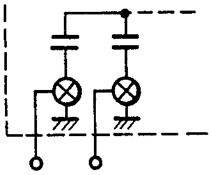
Figure 5D:
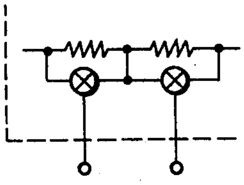

In the case of FIGS. 4A to 4C, there are instances where the terminals of elements to be switched are directly led to the outside as shown in FIGS. 5A and 5B, and instances where the terminals are led out through volatile semiconductor switches as depicted in FIGS. 5C and 5D. In both cases it is necessary to selectively fix the external terminals to logic 1 or logic 0 states, an operation which was formerly accomplished by soldering or through the use of screws. Such methods were sufficient when an adjustment was completed through just one operation, but were impractical and required a time consuming procedure when adjustments were accomplished through trial-and-error methods.

The present invention allows adjustments to be readily performed even if trial-and-error adjustments are required, this being accomplished through the provision of an adjustment circuit which has the capability of retaining in its memory the amount of an adjustment even if the power source is disconnected due to replacement of a battery or the like. A preferred embodiment of such a circuit is shown in FIG. 6A.

Figure 6A:
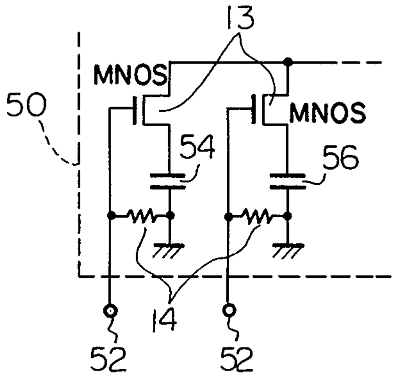
FIGS. 6A and 6B are circuit diagrams depicting methods of leading out non-volatile memory elements.

In FIG. 6A, there is shown a preferred embodiment of an adjustment circuit for an electronic device according to the present invention. The adjustment circuit comprises first and second adjusting elements 54 and 56, first and second non-volatile memory elements 13, and first and second high resistances 14, all of which are incorporated in IC chip 50. The gate electrodes of the memory elements 13 are led out from the IC chip 50 and connected to external terminals 52, respectively, and also connected to a fixed potential (not necessarily earth) of a power source through high resistances 14.

The memory elements 13 have first electrodes connected together and second electrodes connected to the fixed potential of the power source via adjusting elements such as capacitors 54 and 56, respectively.

Figure 6B:
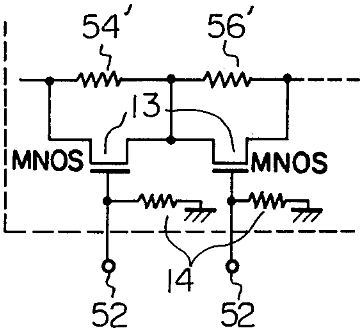

FIG. 6b shows a modified form of the adjustment circuit shown in FIG. 6A. In this illustrated modification, the adjustment circuit employs first and second resistors 54′ and 56′ as adjusting elements which are connected in series. The second electrodes of the memory elements 13 are connected to first terminals of adjusting elements 54′ and 56′, and the first electrodes of the memory elements 13 are coupled together and connected to a junction between the adjusting elements 54′ and 56′.

Figure 7A:
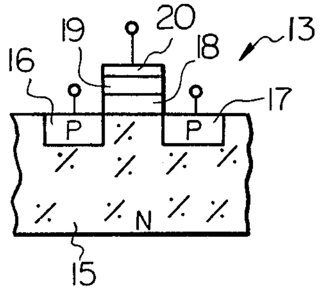
FIGS. 7A and 7B are a cross-sectional view of a non-volatile memory element and a graph of its characteristics, respectively.

The non-volatile memory element 13 may have a structure best seen in FIG. 7A. A source region 16 and drain region 17 are diffused on a silicon substrate 15. Reference numeral 18 denotes a thin film of silicon oxide formed on substrate 15, 19 a strongly dielectric material such as silicon nitride or aluminum oxide formed in silicon oxide film 18, and 20 a metallic element formed on dielectric material layer 19, thereby forming a gate electrode.

Figure 7B:
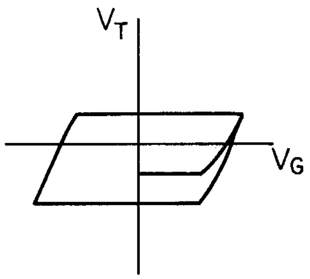

The characteristics of the abovementioned non-volatile memory element are shown in FIG. 7B. Hysteresis is shown with the threshold voltage plotted against the gate voltage. More specifically, if a voltage on the order of several dozen volts is applied so that the gate electrode goes positive, the threshold voltage will shift in the positive direction; if the voltage is applied so that the gate electrode goes negative, the threshold voltage will shift in the negative direction. Thereafter, this threshold voltage will be maintained as long as a high voltage is not applied in the opposite direction.

Thus in FIGS. 6A and 6B, the gate electrode of memory element 13 is normally maintained at a fixed potential by resistance 14. However, if a high voltage is selectively applied to raise or lower the threshold voltage of the element with respect to the fixed potential, the gate electrode will be selectively turned ON or OFF so that the abovementioned switching objective can be attained. Since the memory of the non-volatile memory element is not disrupted by disconnection of the power source, readjustment following replacement of the battery is not required. Even if a readjustment is necessary, this can be easily accomplished by the mere application of a positive or negative voltage. Extremely advantageous effects can be obtained when trial-and-error adjustments are required.

FIG. 8A is another preferred embodiment of an adjustment circuit of the present invention.

In FIG. 8A, the adjustment circuit comprises a non-volatile memory element 58, an adjusting element 60 such as a capacitor, a volatile semiconductor transistor switching element 68, and resistors 62 and 64. The memory element 58 has its source terminal connected to a fixed potential 59 of a power source, drain electrode connected through the resistor 64 to another fixed potential 60 of the power source, and a gate electrode connected to an external terminal 70 and to said another fixed potential 60 of the power source via the resistor 62. The drain electrode of the memory element 58 is also connected to a gate terminal of the volatile semiconductor transistor element 68, so that the transistor 68 is turned On or Off in dependence on the potential level of the drain electrode of the memory element 58, thereby selectively coupling the capacitor 61 to a line 72.

FIG. 8B shows a modified form of the adjustment circuit shown in FIG. 8A. In this modification, the gate electrode of the memory element 58 is connected to the external terminal 70 and to the fixed potential of the power source through a resistor 74. The semiconductor transistor switching element 68 is controlled by the potential level of the drain electrode of the memory element 58. In this modification, the adjusting element is replaced with a resistor 60′.

FIG. 8C shows another modified form of the adjustment circuit in which a NAND gate 68′ is used as a switching element. The NAND gate 68′ has an input terminal connected to the drain electrode of the memory element 58 and is controlled by the potential level at the drain electrode of the memory element 58.

FIG. 9 shows another preferred embodiment of an adjustment circuit according to the present invention which is an improvement over the embodiments shown in FIGS. 8A to 8C. In this illustrated embodiment, the adjustment circuit comprises a non-volatile memory element 80, an inverter 82, a switching element 84 composed of a NAND gate, and resistors 86 and 88. The memory element 80 has its gate electrode connected to an external terminal 90 and to a high potential 92 of a power source through the resistor 86. The memory element 80 also has a source electrode connected to a low potential 94 of the power source and a drain electrode coupled through the inverter 82 to one input of the switching element 84 and coupled through the resistor 88 to an output. An output of the inverter 82 is connected to an output terminal OUT. The switching element 84 also has another input adapted to receive a clock signal φR. When the memory element is maintained in the ON state in the circuits of FIGS. 8A to 8C, a current normally flows through resistor 64. This is an undesirable condition in view of increased power consumption. However, in the circuit of FIG. 9, memory element 80 is an N-channel type element of which the source electrode is connected to a low potential (hereafter referred to as L), the gate electrode is connected to a high potential (hereafter referred to as H) through resistor 86, and the drain electrode is connected to the input terminal of inverter 82 and the output side of gate 84 through resistor 88, as previously noted. The clock signal φR normally rides at a high logic level but periodically attains a low logic level for an extremely short period of time, or automatically immediately after the application of the power source voltage, or attains the low level for an arbitrary period of time through the use of manual means.

When the signal φR is at the L level, the output of gate 84 is at the H level. If it is assumed that memory element 80 is ON, the drain potential is at L level and the output of the inverter 82 is at H level. When φR returns to its regular state, that is, to the H level, the output of gate 84 attains an L level; thereafter, the output of inverter 82 remains at the H level. Even if signal φR is at the L level, the drain electrode of the memory element 80 will attain the H level, and the output of inverter 82 the L level, if the memory element 80 is OFF. Accordingly, the output of gate 84 will remain at H level, and the output of inverter 82 will remain at L level, even if φR attains the H level. It is therefore obvious that a current will flow in the memory element 80 only when the element is ON and signal φR is at the L level. Current consumption can thus be reduced.

For the resistor 88 it is desirable to make use of polysilicon into which an impurity has been diffused.

The reason is as follows. If the resistor 88 were to make use of a diffused resistance or the ON resistance of a transistor, specialized isolation would be required as well as a large connection breakdown resistance in order to prevent a short-circuit between the gate electrode and substrate, due to the connection of the resistor 88, when a high voltage is applied to the gate electrode of the memory element. These measures would pose a number of manufacturing difficulties.

Next, there is the danger that other elements will be subjected to large voltages through a memory element drain electrode or source electrode that is not directly connected to a power source. In such a case, the drain and source electrodes would be connected to the high and low potential sides of the power source through diodes as shown in FIG. 10.

In FIG. 10, the adjustment circuit comprises a non-volatile memory element having its gate electrode connected to an external terminal 101 and to a fixed potential of the power source through a high resistance 102. The memory element 100 has its drain electrode connected to the high and low potentials of the power source via diodes 104 and 106, and its source electrode connected to the high and low potentials of the power source via diodes 108 and 110.

According to the present invention, particularly advantageous effects can be obtained through application in IC's which employ complementary MOS insulated gate field effect transistors.

The gist and features of the present invention can be summarized in the following manner.

(1). A non-volatile memory element is incorporated in the integrated circuitry of a miniature electronic device. This permits adjustment to be readily accomplished, simplifies the amount of work and lowers cost.

(2). The gate electrode of the memory element is connected to a fixed potential through a high resistance within the IC. This removes the necessity of such operations as connecting the external terminals to ground after completing the writing of information into the memory element.

(3). The high resistance which connects the gate electrode to the fixed potential utilizes polysilicon into which an impurity has been diffused. This removes the necessity of providing special isolation for a resistor.

(4). The memory element drain and source electrodes which are not directly connected to a power source are connected to the high and low potential sides of the power source through diodes. This prevents other elements from being subjected to a large voltage through the drain and source electrodes when the gate electrode of the memory element is applied with a large voltage.

(5). In a circuit in which adjustment elements such as condensers, resistors or diodes are switched by means of a switch, the memory element is not employed directly as the switch but is adapted to electronically operate the switch element, the control of the gate being accomplished responsive to the memory of the memory element. This makes it possible to avoid the effects of transient changes in the memory element.

(6). The drain electrode of the non-volatile memory element 80 shown in FIG. 9 is connected to one end of a memory loop constructed of a volatile logic gate. This makes it possible to reduce power consumption when the memory element is in the ON state.

In accordance with the present invention as described above, it is possible to realize an IC for a miniature electronic device which is easily adjusted and highly reliable.

What is claimed is:

1. An adjustment circuit for a miniature electronic device including an external terminal arranged to receive a voltage signal, and a power source having a fixed potential, comprising an adjustment element, a non-volatile semiconductor memory element having a gate electrode, a source electrode and a drain electrode serving as an output, the source electrode of said memory element being connected to the fixed potential of said power source and the gate electrode of said memory element being connected to said external terminal and responsive to said voltage signal to assume one operative state, and a volatile semiconductor switch element having a control terminal connected to the output of said non-volatile semiconductor memory element and opened and closed in response to the memory of said non-volatile semiconductor memory element, said volatile semiconductor switch element having an output terminal connected to one terminal of said adjustment element to control the operation thereof.

2. An adjustment circuit as claimed in claim 1, in which at least one of the drain and source electrodes of the non-volatile semiconductor memory element is connected to both electrodes of the power source through diodes.

3. An adjustment circuit for a miniature electronic device including an external terminal arranged to receive a voltage signal, and a power source having first and second fixed potentials, comprising, an adjustment element, a non-volatile semiconductor memory element having gate, drain and source electrodes, a memory circuit composed of a volatile logic gate and connected to the drain electrode of said non-volatile semiconductor memory element, and a switch element having a first terminal and a second terminal connected to one terminal of said adjustment element, said memory circuit having an output terminal connected to the first terminal of said switch element, the source electrode of said non-volatile semiconductor memory element being connected to the first fixed potential of said power source and the gate electrode of said non-volatile semiconductor memory element being connected to said external terminal to be responsive to said voltage signal for controlling the operation of said memory circuit to maintain said adjustment element in a predetermined state.

4. An adjustment circuit for a miniature electronic device having an external terminal arranged to receive a voltage signal and a power source having a fixed potential, comprising:

an adjustment element having a first terminal connected to the fixed potential of said power source, and a second terminal;

a resistor having a high resistance;

a non-volatile semiconductor memory element arranged to operate in two states and having a drain electrode, a source electrode connected to the second terminal of said adjustment element, and a gate electrode connected to the fixed potential of said power source through said resistor whereby said gate electrode is normally maintained at said fixed potential such that said non-volatile semiconductor memory element assumes one state, said gate electrode of said memory element being also connected to said external terminal and responsive to said voltage signal to assume another state to switch the connected state of said adjustment element.

5. An adjustment circuit as claimed in claim 4, in which said resistor essentially consists of a polysilicon containing an impurity.

6. An adjustment circuit for a miniature electronic device having a power source having a fixed potential, an external terminal arranged to receive a voltage signal of a predetermined voltage potential different from said fixed potential of said power source, comprising:

an adjustment circuit element having a first terminal connected to the fixed potential of said power source, and a second terminal;

a resistor having a high resistance; and a non-volatile semiconductor memory element having a first electrode serving as an output, a second electrode connected to the second terminal of said adjustment circuit element, and a third electrode connected to the fixed potential of said power source through said resistor to assume one operative state to maintain said adjustment circuit element in its first predetermined state, the third electrode of said non-volatile semiconductor memory element being also connected to said external terminal and responsive to said voltage signal whereby said non-volatile semiconductor memory element assumes another operative state to maintain said adjustment circuit element in its another predetermined state.

* * * * *